(12) United States Patent
Mune et al.

(10) Patent No.: US 6,379,159 B1
(45) Date of Patent: Apr. 30, 2002

(54) INTERPOSER FOR CHIP SIZE PACKAGE AND METHOD FOR MANUFACTURING THE SAME

(75) Inventors: Kazunori Mune; Kazuo Ouchi; Satoshi Tanigawa; Hirofumi Fujii, all of Osaka (JP)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 09/541,898

(22) Filed: Apr. 3, 2000

(30) Foreign Application Priority Data

Apr. 2, 1999 (JP) .......... 11-096918
Aug. 6, 1999 (JP) .......... 11-224221

(51) Int. Cl.$^7$ .............................. H05G 3/36
(52) U.S. Cl. .............. 439/71; 29/852; 29/842; 29/846
(58) Field of Search .......... 29/842, 852, 846; 439/66, 71

(56) References Cited

U.S. PATENT DOCUMENTS

| | | | |
|---|---|---|---|
| 5,231,751 A | * | 8/1993 | Sachdev et al. ........... 29/852 |
| 5,570,504 A | * | 11/1996 | DiStefano et al. ......... 29/830 |
| 5,634,268 A | * | 6/1997 | Dalal et al. .............. 29/852 |

FOREIGN PATENT DOCUMENTS

| | | | |
|---|---|---|---|
| JP | 07-186323 | 7/1995 | ..... B32B/15/08 |
| JP | 10-135598 | 5/1998 | ..... H05K/3/00 |
| JP | 10-242350 | * 9/1998 | ..... 29/852 |

* cited by examiner

Primary Examiner—Renee Luebke
Assistant Examiner—Briggitte R. Hammond
(74) Attorney, Agent, or Firm—Sughrue Mion, PLLC

(57) ABSTRACT

In a method for manufacturing an interposer for CSP and its intermediate body, a first insulating layer is formed on a cathode substrate. An opening is formed at a position in the insulating layer where a contact is to be formed so that the surface of the substrate is exposed to the inner bottom of the opening. The opening is filled with metal by the electroplating using the cathode substrate as a cathode to form a conductive path. A circuit pattern which is contact with the conductive path is formed on the insulating layer. The cathode substrate is removed partially or entirely so that the end surface of the conductive path is exposed to form a contact. This permits a variation of the heights of a plurality of contacts to be reduced.

11 Claims, 8 Drawing Sheets

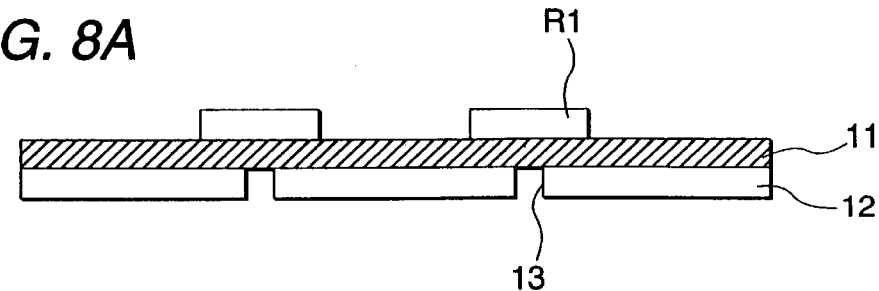
PRIOR ART FIG. 8A
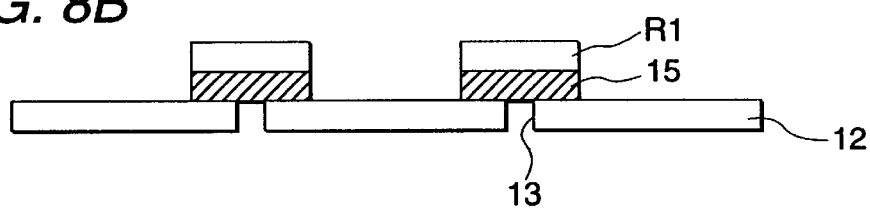
PRIOR ART FIG. 8B
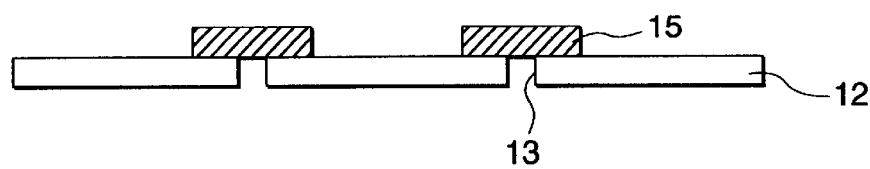
PRIOR ART FIG. 8C
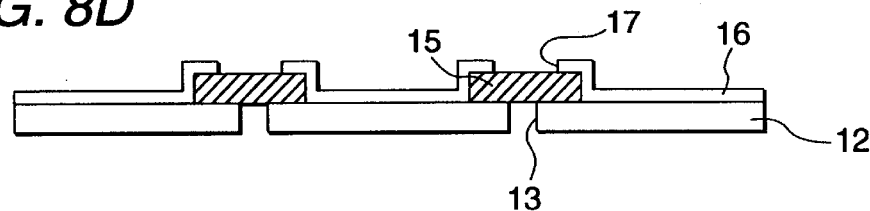
PRIOR ART FIG. 8D
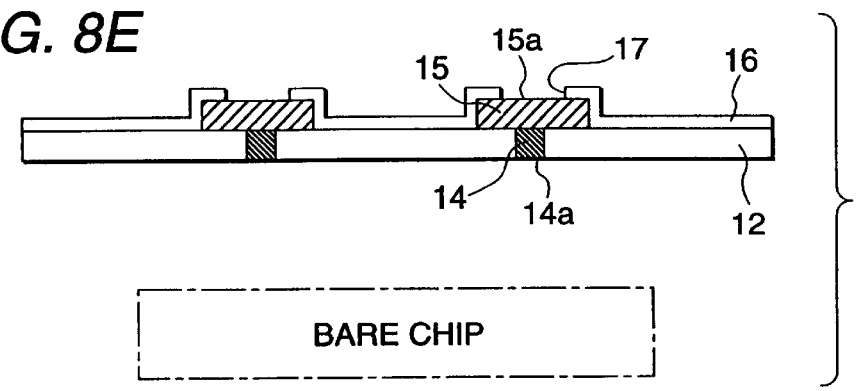
PRIOR ART FIG. 8E

INTERPOSER FOR CHIP SIZE PACKAGE AND METHOD FOR MANUFACTURING THE SAME

BACKGROUND OF THE INVENTION

1. Field of the Invention

The present invention relates to technology of an interposer for a chip size package which is interposed between a semiconductor device and a circuit board for electric connection therebetween when the semiconductor device is packaged on the circuit board.

The present application is based on Japanese Patent Applications No. Hei. 11-96918 and 11-224221, which is incorporated herein by reference.

2. Description of the Related Art

Generally, a large number of semiconductor devices such as ICs are formed on a wafer, and separated into individual chips which are connected to several kinds of circuit boards. Further large-scale integration of an IC increases the number of electrodes formed on a single chip so that the shape of each electrode and the array pattern is fine and provide a narrow pitch. In the field of packaging technology, a method (e.g. flip-chip bonding) has been proposed which does not use wire bridging between a chip and a circuit board, but use correlative connecting between the electrode position of the chip and conductor portion of the circuit board. In order to satisfy the requirement of miniaturization, a bare chip packaging in which the chip is packaged in an naked state has been proposed.

In recent years, in accordance with the above requirement, a "chip size package" (CSP) has been proposed which packages the chip on a circuit board with its size being maintained to occupy a much smaller area than a conventional package does. The CSP achieves the packaging of the chip size by interposing a flexible circuit board (called "interposer") 20 equipped with a contact between a chip 30 and an external circuit board 40 for their interconnection as shown in FIG. 7A. The circuit board may be various kinds such as a circuit board for packaging or a general circuit board on which a large number of elements are also packaged.

As shown in FIG. 7A, the interposer 20 includes a circuit pattern 22 within an insulating substrate 21 (which actually has a laminated structure) which has a size approximately equal to or slightly larger than the chip 30. The interposer 20 has also a contact 23 in the insulating substrate 21 on the side of the chip 30 at the position which individually corresponds to the electrode pad (not shown) of the chip. The interposer has also a contact 24 in the insulating substrate 21 on the side of the circuit board at the position which corresponds to the pad of the circuit formed on the circuit board. These contacts 23 and 24 are formed in various manners of a bump, a flat form in flush with the substrate surface, etc. These large number of contacts 23 and 24 lead to the internal circuit pattern 22. In this way, the individual electrodes of the chip is connected to the circuit 41 of the circuit board 40 through the contact 23, circuit pattern 22 and contact 24 of the interposer 20.

However, the contacts formed in the conventional interposer have greatly different heights with respect to the surface of the insulating substrate 21. Now, the "height" refers to the height of the contact which is not only projected from the substrate surface but also dented therefrom. Because of such height difference, some of the contacts cannot be in contact with the electrodes formed on the rigid chip 30. This gives rise to a problem in reliability of connection.

In the example shown in FIG. 7B, a contact 23b, which is located between the surrounding contacts 23a and 23c and has a projecting height lower than them by a distance y, cannot be brought into contact with the chip 30. If the projecting height of the pertinent contact is slightly lower than that of the surrounding contacts, it is apparently in contact with the chip. However, its contact area is smaller by the degree of reduction of a crushing margin when it is brought into contact. This cannot provide good reliability in connection.

Since the interposer 20 is interposed between the chip 30 and the circuit board 40, the above problem in connection between the interposer 20 and the chip 30 occurs also in connection between the interposer 20 and the circuit board 40. Specifically, as understood by replacing the chip 30 by the circuit board 40, the contact which is lower by y in its projecting height than the surrounding contacts cannot be brought into contact with the conductor portion of the circuit board.

SUMMARY OF THE INVENTION

A primary object of the present invention is to solve the above problems occurring in connection between the interposer and the chip and between the interposer and the circuit board.

Another object of the present invention is to provide a method of manufacturing an interposer for CSP which can reduce a difference in the height among contacts with respect to a surface of an insulating substrate.

Still another object of the present invention is to provide a preferable interposer for CSP and its intermediate member which can be obtained by the above manufacturing method.

The method for manufacturing an interposer for CSP according to the present invention, interposer itself and its intermediate body have the following aspects or features.

(1) A method for manufacturing an interposer for a chip size package, comprising:

a first step of forming a first insulating layer on a substrate which is made of metal and usable as a cathode for electroplating;

a second step of forming a first opening at a position of the insulating layer corresponding to a conductor portion of an object for connection so that a surface of the substrate is exposed to an inner bottom of the opening;

a third step of filling the first opening with metal by electroplating using the substrate as a cathode, thereby forming a conductive path in the first opening;

a fourth step of forming a circuit pattern in contact with the conductive path on the first insulating layer; and a fifth step of removing the substrate partially or entirely to expose the first insulating layer inclusive of an end surface of the conductive path.

(2) A method for manufacturing an interposer according to the aspect (1), wherein the conductor portion of the object for connection is an electrode of a chip.

(3) A method for manufacturing an interposer according to the aspect (1), wherein the conductor portion of the object for connection is a conductor portion of a circuit board.

(4) A method for manufacturing an interposer according to the aspect (1) or (2), wherein the first insulating layer is made of photosensitive and thermal melting type adhesive resin.

(5) A method for manufacturing an interposer according to the aspect (1), further, after the fourth step, comprising the step of:

forming a second insulating layer so as to cover the circuit pattern and forming a second opening from which the circuit pattern is exposed.

(6) A method for manufacturing an interposer according to the aspect (1), wherein the conductor portion of the object for connection is a conductor portion of a circuit board, further comprising, after the fourth step, the step of:

forming a second insulating layer so as to cover the circuit pattern and forming a second opening exposing the circuit pattern at a position of an electrode of a chip which is the object for connection, and filling the second opening with metal.

(7) A method for manufacturing an interposer according to the aspect (6), wherein the first insulating layer is made of photosensitive resin, and the second insulating layer is made of photosensitive and thermal melting type adhesive resin.

(8) A method for manufacturing an interposer according to the aspect (1), wherein in the fifth step, the substrate for a cathode is removed to be left as a frame for supporting the interposer on its periphery.

(9) A method for manufacturing an interposer according to the aspect (1), wherein the substrate has an outer size enough to arrange a plurality of interposers for a chip size package, and the plurality of interposers which are collected on the substrate in a state where they can be separated in individual components after they have experienced the first to fifth steps.

(10) A method for manufacturing an interposer according to the aspect (9), wherein in the fifth step, the substrate is removed to be left as frames which surround and support the plurality of interposers individually, and/or to be left as a frame which inclusively surrounds the plurality of interposers.

(11) An interposer for a chip size package having a metallic frame on its outer periphery.

(12) An intermediate body of an interposer for a chip size package wherein a sheet-like collection of a plurality of interposers for a chip size package are provided, and a metallic frame which inclusively surrounds all the plurality of interposers is provided on the outer periphery of the collection.

(13) An intermediate body of an interposer for a chip size package wherein a sheet-like collection of a plurality of interposers for a chip size package are provided, and each of metallic frames is provided on the periphery of each the individual interposers.

In a conventional typical process of making a contact, as understood from the contacts on a chip side shown in FIG. 7B, openings are made in an insulating substrate 21 and circuit patterns 22a–22c are exposed to inner bottoms of the openings. The respective openings are filled with highly-conductive metal precipitated in each of the openings by electroplating using each circuit pattern as a cathode, thereby providing contacts 23a–23c on the top. However, the electroplating theoretically produces variations in the current density, and hence different thicknesses of the plated films at different positions. Namely, the heights of the contacts 23a–23c are different for the respective openings because the amount of precipitation of material varies for each opening.

Unlike the above conventional process, in accordance with the present invention, as shown in FIG. 1A, a substrate 1 for a cathode (hereinafter referred to as "cathode substrate") which will be removed finally is prepared. As shown in FIG. 1B, an opening 3 is filled with a conductive path 4 using the cathode substract. As shown in FIOG. 1C, the cathode is removed to expose the end surface 4a of the conductive path so that it is used as a contact.

In short, the contact surface in the conventional process is a final portion grown from a cathode plate (circuit pattern) to a far substrate surface (reference plane) through the conductive path. On the other hand, the contact surface in the present invention is an initial portion precipitated to the surface of the cathode substrate (plane abutting on the reference plane). Therefore, addition of a thin film of Au on the contact surface does not produce a great variation in the heights of the contacts.

Now it is assumed that the opening provided in a polyimide substrate having a thickness of 20 $\mu$m is filled with Cu so that the end surface of Cu is used as a contact. In this case, there is the following variation of in numerical values of the contact heights.

Where it is desired that the contact height is 0 $\mu$m (i.e. the contact is flush with the substrate surface), in accordance with the present invention, as shown in FIG. 6A, the substrate surface appearing by removing the cathode substrate is flush with the contact surface, the variation thereof is theoretically ±0. In contrast, in the conventional process, as shown in FIG. 6C, the contact height is a result when the metal has been grown to the height of 20 $\mu$m from the circuit pattern. Thus, the variation is ± about 3 $\mu$m. The shape of the contact surface is not flat but convex as it is in the precipitated state.

Where it is desired that the contact height is 10 $\mu$m, in accordance with the present invention, as shown in FIG. 6B, Cu is further grown by 10 $\mu$m from the contact surface acquired in FIG. 6A. The variation is about ±2 $\mu$m. In contrast, in the conventional process, as shown in FIG. 6D, the contact height is a result when the metal has been grown to the height of 30 $\mu$m from the circuit pattern. Thus, the variation is ± about 5 $\mu$m.

To reduce the variation in the contact height is useful for both chip side and circuit board side. For this reason, from the standpoint of reliability of connection, whether the contact with less variation, which appears by removing the cathode substrate, should be adopted on the chip side or the circuit board side may be determined according to the requirement of a product.

On the other hand, in accordance with the present invention, it is noticed that the property required for the insulating layer on the chip side may be different from that on the circuit board side. It has been found that the substrate surface appearing when the cathode substrate is removed and its contact may be preferably adopted for the circuit board side. The details thereof will be explained below.

From the standpoint of a method of making an opening, both insulating layers are preferably made of photosensitive resin, particularly, photosensitive polyimide which is "polyimided" by heating for curing. However, in the insulating layer on the chip side, which is further conditioned on chip packaging, the insulating layer preferably serves as an adhesive layer as described later. Therefore, the insulating layer is made preferably of photosensitive and thermally-melting adhesive resin. On the other hand, the material of the insulating layer on the circuit board side may be only photosensitive.

In many cases, some photosensitive resin materials (resin on the circuit board side) exhibiting excellent characteristics have a curing temperature exceeding the appropriate curing temperature of the photosensitive and thermally-melting adhesive resin (resin on the chip side). Particularly, where [ODPA: (MAPB, APDS)] (described later) is used as the resin on the chip side and [(ODPA, BPDA):(PPD, DDE)

(described later) is used as the resin on the circuit board side, the appropriate curing temperature of the former is 300° C. whereas that of the latter is 400° C., which results in a large difference of 100° C. therebetween. In the case where there is such a large difference in the curing temperature, it is preferable to form insulating layers in the order of a higher curing temperature. Namely, the preferred order of making the insulating layers is that as shown in FIGS. 5A–5F, the first insulating layer initially formed on the cathode substrate 1 is used as an insulating layer having a higher curing temperature on the circuit board side, and the second insulating layer 6B formed thereafter is used as an insulating layer having a lower curing temperature on the chip side.

In the above processing order, the first insulating layer can be cured sufficiently at 400° C. ("full curing") without considering the affect on the environment so that it can sufficiently exhibit the inherent property. Even when the second insulating layer is cured at 300° C., the first insulating layer will not be damaged because it has experienced the heating treatment at 400° C. Thus, both first insulating layer and second insulating layer can exhibit their inherent properties.

When there is a large difference in the curing temperature, if the first insulating layer is formed using the resin having a lower curing temperature, it will be damaged by the curing or sputtering of the second insulating layer at a high temperature. Thus, the first insulating layer suffers from quality deterioration that its property as thermally-melting adhesive resin (fluidity of the resin) is lost, the entire layer becomes fragile and the adhesive force is lowered. In this case, taking the quality of the first insulating layer into consideration, if the second insulating layer is cured at the lower temperature, it will not be subjected to the curing at the appropriate temperature. Thus, the second insulating layer will be located in an "under-curing" state where the polyamide acid will not be changed into polyimide. The "under-curing" state refers to the state where the curing condition is not sufficiently satisfied, i.e. the insulating layer cannot exhibit the inherent resin properties in terms of its mechanical strength, heat-resistance, medicine resistance, etc. This greatly deteriorates the reliability of the interposer structure itself.

The features defined in the aspects (11) to (13) of the present invention are an interposer, or intermediate bodies obtained by the process according to the present invention, in which the cathode substrate is not entirely removed but left as a metallic frame on the periphery. These aspects suppress the variation in the contact heights and provide the following advantages.

In a conventional technique of packaging of an interposer on a chip, a plurality of interposers are collected in a matrix on a sheet and the chips are mounted mass-productively on the sheet and cut into individual packaging bodies. Each interposer is a very thin flexible circuit board as a whole. The sheet composed of a collection of these interposers provides poor handling with no stiffness. In order to set such a sheet in a packaging machine, a dedicated metallic jig has been conventionally used. The metallic jig has a frame structure which can support the outer periphery of the sheet, generally a metallic frame plate having a thickness of 50 μm–500 μm. Guide pins for positioning are provided on the respective sides of the frame of the metallic jig. These pins are fit into holes for positioning formed on the outer periphery of the sheet so that the sheet is secured to fixed positions of the metallic jig. Since the outer periphery of the sheet is supported by the metallic jig, handling of the sheet can be improved and its positioning on the packaging machine can be made properly. On the other hand, in accordance with the present invention, as shown in FIG. 2A as an intermediate body defined in the above aspect (12), the cathode substrate 1 is not completely removed but left as a frame serving as a metallic jig. Unlike the conventional packaging process, this feature makes it unnecessary to prepare a metallic jig for an interposer and to set the interposer sheet in the metallic jig. Incidentally, the frame portion will be removed when the sheet is cut.

In order to handle a chip having a large number of electrodes, it is necessary to make the outer size of the interposer larger than that of the chip thereby to extend the circuit pattern outwardly of the chip. To this end, for example, as shown in FIG. 3, the region where the opening 7 filled with a solder bump 8 is formed on a circuit board side is greatly extended out. However, the portion of the interposer extended out from chip is thin and flexible so that it is difficult to connect the interposer to an external circuit and handle it smoothly. In order to formulate the interposer in such a structure, in accordance with the present invention, as shown in FIGS. 4F and 2B, the cathode substrate 1 is not completely removed, but only the regions in which the individual chips are fit are etched so that the substrate is left as frames each of which supports the outer periphery of each interposer. Such a structure corresponds to the interposer defined in the aspect (11) and its intermediate body defined in the aspect (13). In these aspects, in the case of the interposer having a larger size than the chip size, the portion of the interposer extended out from the chip can be given stiffness. This makes it unnecessary to provide a reinforcement plate redundantly.

The above and other objects and features of the present invention will be more apparent from the following description taken in conjunction with the accompanying drawings.

BRIEF DESCRIPTION OF THE DRAWINGS

In the accompanying drawings:

FIGS. 8A to 8E are sectional views of an interposer for explaining the process of manufacturing the interposer according to conventional art.

DETAILED DESCRIPTION OF THE PREFERRED EMBODIMENTS

The method of manufacturing an interposer for CSP (hereinafter simply referred to as "interposer") according to the present invention includes at least the above first to fifth steps as described above as the manufacturing method according to the first aspect.

Now referring to FIGS. 1A to 1C, an explanation will be given of the case where a first insulating layer formed initially on a cathode substrate resides on the side connected to a chip, i.e. the first aspect supplied with the second aspect (hereinafter referred to as the configuration of (I)). Incidentally, the second and third aspect will be referred to as necessary.

Figure 3:
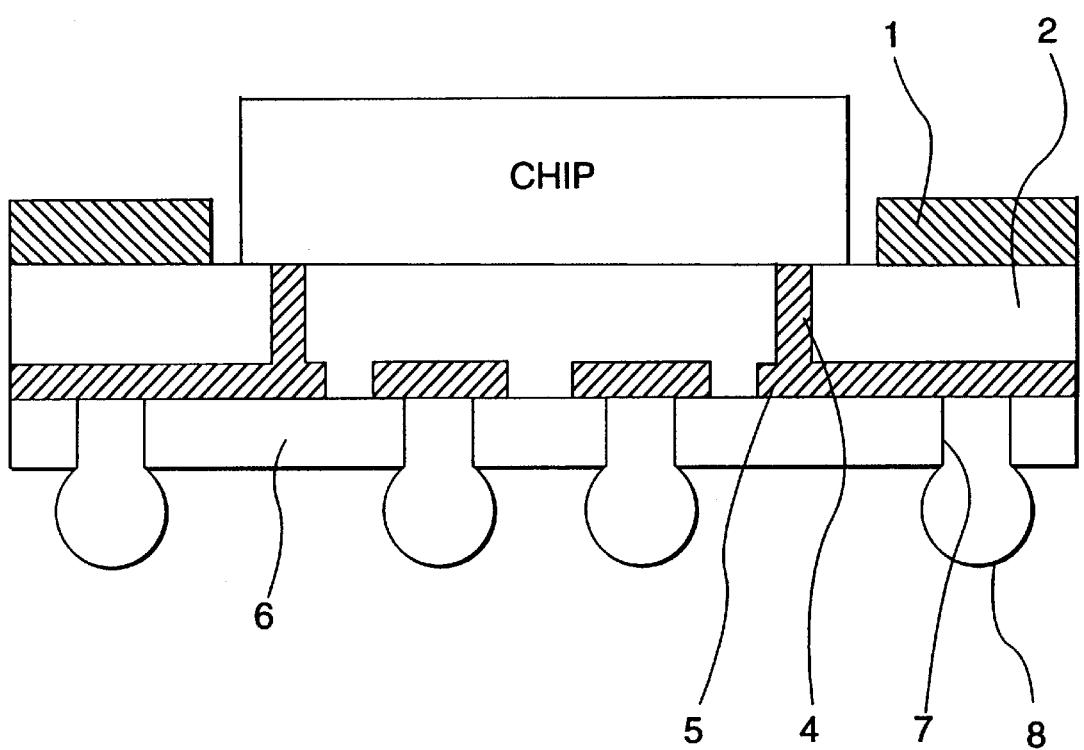
FIG. 3 is a sectional view of an interposer manufactured by the method according to the present invention.

The outer shape of an interposer corresponding to a single chip differs according to the connecting structure with a circuit board. The interposer for a chip size package has an outer shape of various shapes inclusive of a square, rectangle, etc., substantially the same as that of the chip, a size of 3 mm×3 mm to 20 mm×20 mm. Where the chip has a large number of electrodes, as shown in FIG. 3, the interposer is enlarged externally from the outer periphery of the chip.

An individual interposer will be described below. However, it is preferred in manufacturing that a plurality of interposers are formed in a planar matrix as if semiconductor devices are formed on a wafer, and divided in individual pieces in a final step. In this case, the outer shape of the cathode substrate to be prepared and respective layers to be formed subsequently includes the arrangement of the plurality of interposers.

Figure 1A:
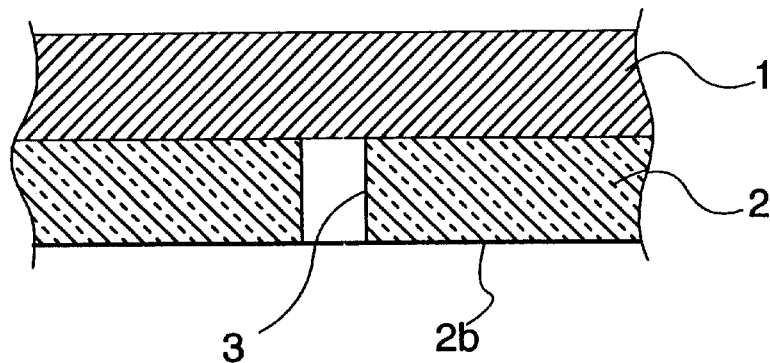
FIGS. 1A to 1C are enlarged sectional views of a single contact in an interposer in the process in which the interposer is manufactured by the method according to the present invention.

In accordance with the configuration of (I), in the first step, first, as shown in FIG. 1A, a first insulating film 2 is formed on the one surface of a cathode substrate 1. The material of the cathode substrate 1 may be any metal as long as it can be used as a cathode for electroplating, preferably, an 42-alloy, stainless steel, etc. from the standpoint of stiffness, easy etching, availability, low linear thermal expansion coefficient, etc. The thickness of the cathode substrate 1 may be enough to be operable as a cathode, preferably 10–500 μm from the standpoint of view of the mechanical strength or electric characteristic as a cathode for electroplating.

The thickness of the first insulating layer 2 maybe preferably 5–30 μm. In the configuration of (I), the first insulating layer will be finally bonded to the chip. Therefore, this layer is preferably made of adhesive material (particularly thermally melting type material) so that it is not necessary to prepare a separate adhesive layer. This layer may be preferably made of a photosensitive material capable of making an hole through light-exposure/development. This can omit to use an excimer laser for hole making which is high in the running cost and low mass-productivity. Therefore, the first insulating layer may be most preferably made of an insulating layer of photosensitive and thermally-melting type adhesive resin (hereinafter referred to as simply "material for the first insulating layer"). This corresponds to the above second aspect of the present invention. Concretely, the first insulating layer may be made of photosensitive polyimide, photosensitive polyethersulfone, etc. particularly the photosensitive polyimide.

The photosensitive polyimide can be acquired as a polyimide precursor capable of appearing photosensitivity by mixing a photosensitive agent in polyamic acid (polyamide acid). In this case, the material of the insulating layer is a photosensitive polyimide precursor in the step before light-exposure for hole making, and may be partially imided after the light-exposure/development (i.e. after hole making). It will be polyimide resin in the step after curing for "polyimiding" by heating (state of the insulating layer in a product in which a device can be packaged).

The photosensitive polyimide precursor can be actually made by reacting an acid dianhydride component and a diamine component at an equal mole ratio within a suitable organic solvent (e.g. N,N-dimethylacetamide, N-methyl-2-pyrrolidone, etc.) to create polyamic acid and mixing a photosensitive agent into the polyamic acid. As necessary, epoxy resin, nadiimide, or maleimide may be mixed to the precursor.

The acid dianhydride component may be e.g. 2,2-bis(3, 4-dicarboxyphenyl)hexafluoropropane dianhydride (6FDA); TMEG (ester compound of ethylene glycol and trimellitic acid anhydride); 3,3',4,4'- oxydiphthal acid dianhydride (ODPA); 3,3',4,4'-benzophenone tetracarboxylic acid dianhydride, etc.

The diamine component may be e.g. 4,4'-diaminophenylether (DDE); 1,3-bis (4-aminophenoxy) benzene (MAPB), 1,3 (3-aminophenoxy) benzene (MAPB), bisaminopropyltetramthyldisiloxane (APDS), m-phenylenediamine (MPD), etc.

The preferred combination of the acid dianhydride component and the diamine component in the representation [acid dianhydride component : diamine component] may be [ODPA : (MAPB, APDS)], [ODPA: (PAPB, APDS)], [ODPA: (MPD, APDS), [(ODPA,6FDA): (MAPB, APDS), [(ODPA, 6FDA):(PAPB, APDS)], etc. The amount of APDS in the diamine in these combination is preferably 10–30 mol %.

The photosensitive agent may be preferably 1,4-dihydropyridinederivative, and particularly 1-ethyl-3,5-dimethoxycarbonyl-4-(2-nitrophenyl)-1,4-dihydropyridine, or 1,2,6-trimethyl-3,5-dimethoxycarbonyl-4-(2-nitropheryl)-1,4-dihydropyridine.

The photosensitive agent is generally used within a range of 0.1–1.0 mol for the total amount of 1 mol of the above acid dianhydride component and the diamine component. If the amount exceeds 1.0 mol. the remaining excessive photosensitive agent will be decomposed and volatilized when the semiconductor device is bonded by thermal crimping. This reduces the adhesive force. If the amount is less than 0.1 mol, the capability of forming the hole pattern will be reduced in the exposure/development step.

In the configuration of (I), the melting viscosity of the material of the first insulating layer at 250° C. is preferably 1000–1000000 Pa·S, particularly 5000–500000 Pa·S.

The glass transfer point (Tg) of the material of the first insulating layer is preferably 50–250° C., particularly 50–150°C.

The first insulating layer can be formed by e.g. (a) applying the solution of the material of the first insulating layer in an organic solvent on a cathode substrate and drying it; and (b) bonding the material for the first insulating layer prepared as a dry film in a separate process to the cathode substrate. The organic solvent in the former process (a) may be N-methyl-2-pyrrolidone; N, N-dimethylacetamide; N, N-dimethylformamide; etc.

In the second step when the configuration of (I) is implemented, as seen from FIG. 1A, an opening 3 corresponding to the contact for a chip is made in the first insulating layer 2 so that the surface of the cathode substrate 1 is exposed to the inner bottom face of the opening 3. Although the opening can be made by any technique, it is preferably made by the exposure/development using the property of the material for the first insulating layer serving as the photosensitive resin.

The process of hole-making by the exposure/development includes the steps of making the region exposed to light using a photomask insoluble (negative type) or soluble (positive type) and removing the material remaining in the hole by development (removal by solvent). This permits the hole to be made more quickly and inexpensively than the conventional excimer laser processing.

The radiation ray for exposure may be any activating radiation ray according to the photosensitivity of the material, i.e. a conventionally known radiation ray used for the exposure/development for the photosensitive resin, such as ultraviolet ray, electron ray, microwave, etc.

The agent for removing the material for development may be any agent capable of removing the material in the region having become soluble after the exposure, i.e. a conventionally known development agent used for the exposure/development for the photosensitive resin such as alkaline water solution.

Figure 1B:
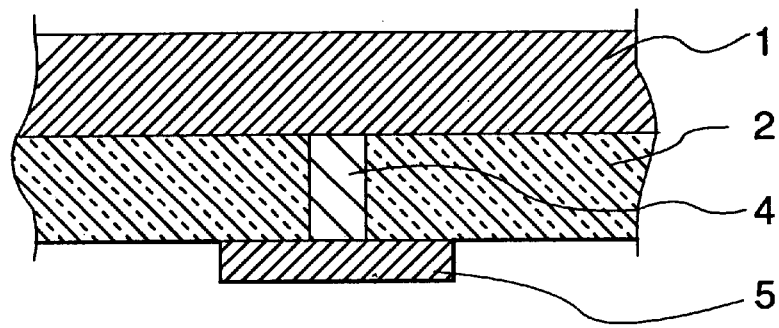

In the third step when the configuration of (I) is implemented, as seen from FIG. 1B, metal is precipitated to fill the opening 3 by the electroplating using the cathode substrate 1 as a cathode so that a conducive path is formed. The metal for the conductive path filled in the opening 3 may be known metal having high conductivity such as CU, Au, Ag, Ni, Sn, Pb, Sn—Pb alloy. The process of first forming the conductive path and thereafter forming a circuit pattern connected thereto is characteristic of the present invention. This process permits the plating to be continued from when the conductive path is completed and to form successively the circuit pattern to be made of the same material as the conductive path.

In the fourth step when the configuration of (I) is implemented, as seen from FIG. 1B, a circuit pattern 5 is formed which is in contact with the conductive path 4, i.e. passes the top of the opening filled with the metal. The circuit pattern may be made of the material generally used for forming a circuit pattern such as Cu, Ni, Au, solder and their alloy.

The circuit pattern 5 can be formed by a subtractive method in which a conductive layer formed on the entire surface of the first insulating layer is patterned; an additive method in which the circuit pattern is directly plotted; and a semi-additive method requiring an underlying conductive layer. The semi-additive method includes the steps of forming an underlying thin film on a first insulating layer by vacuum evaporation and sputtering, forming plating resist on the other region than the circuit pattern on the thin film, forming the circuit pattern by electroplating and finally removing the resist and the underlying conductor thin film on the unnecessary portion.

As described above, as shown in FIG. 1B, it is effective and preferable to form the conductive path 4 and circuit pattern successively in the same electroplating step. In this case, the semi-additive method is preferred in which after the opening is formed in the first insulating layer in the above second step, an underlying conductive thin film is formed on the inner wall and bottom of the opening 3, the plating resist is formed with the circuit pattern being left, and in the same step, the opening is filled with the metal and the circuit pattern is formed.

The underlying conductive thin film in the semi-additive method is preferably a double layer structure composed of Cr/Cu. The Cr layer is preferably 300–700 Å thick and the Cu 1000–3000 Å thick.

The circuit pattern may be used for connection to a circuit board. However, in order to realize a preferred interposer, a second insulating layer 6 is formed to cover the circuit pattern 5, and an opening 7 is formed in the second insulating layer so that the circuit pattern 5 is exposed. This corresponds to the third aspect. The circuit pattern exposed in the opening 7, which will be connected to the circuit on a circuit board or a conductor portion such as a conductor pad, may be used for connection as it is. Otherwise, good conductive metal such as Au may be caused to cover the circuit pattern in the opening 7, may be filled in the opening, or may be grown to form a bump contact.

The second insulating layer is may be made of the same material as that of the first insulating layer. However, in the configuration of (I), it may not be a thermally melting type adhesive resin since it corresponds to the circuit board. It may be also an insulating resin which is used as a base material of a general flexible substrate. It is preferably photosensitive resin in view of the processing of making an opening.

The insulating material composed of a photosensitive resin which does not particularly require adhesiveness includes photosensitive polyethersulfone, photosensitive polyimide, etc. particularly preferably the photosensitive polyimide. The photosensitive polyimide which is preferred for the second insulating layer, as in the case of the first insulating layer, can be actually made by reacting an acid dianhydride component and a diamine component to create polyamic acid and mixing a photosensitive agent with it to forme a photosensitive polyimide precursor. However, it is different from the material for the first insulating layer in that it does not require the adhesiveness. The preferred components of the precursor for the second insulating layer are as follows.

The acid dianhydride component may be e.g. ODPA; 3,3',4,4'-biphenyltetracarboxylic acid anhydride (BPDA), etc. The diamine component may be e.g. p-phenylenediamine (PPD); 4,4'-diaminophenylether (DDE); etc. The photosensitive agent may be the same as that used for the first insulating layer.

The preferred combination of the acid dianhydride component and the diamine component in the same representation [acid dianhydride component : diamine component] as in the first insulating layer maybe [(ODPA, BPDA):PPD], [ODPA, BPDA):(PPD, DDE)], etc.

The second insulating layer is preferably 5 µm–30 µm. The opening made in the second insulating layer for connection to the conductor pad of the circuit board is preferably 200 µm–1000 µm.

Figure 1C:
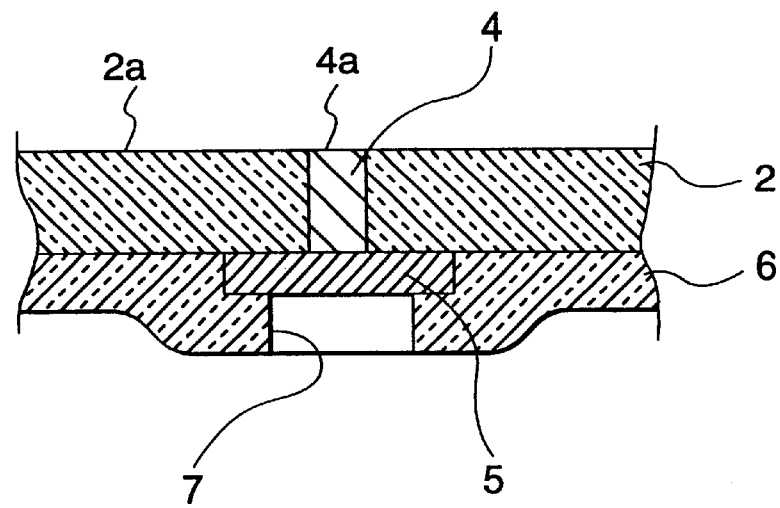

In the fifth step in the configuration of (I), as shown in FIG. 1C, the cathode substrate 1 is removed partially or entirely to expose the first insulating layer 2 inclusive of the end surface 4a of the conductive path 4. As described previously, the end surface thus exposed is a contact portion which is electrically connected to the electrode of the chip. Although the exposed end surface may be used as a contact surface as it is, the surface layer is preferably made of a preferred metallic material.

The surface layer formed on the end surface of the conductive path as a contact surface is preferably made of plated gold (Au) (with a possible underlying layer of nickel (Ni)). Where there is the underlying nickel layer, the Ni layer is preferably 0.5 µm–2 µm and the Au layer is preferably 1 µm5 µm.

With a reference plane of the surface of the first insulating layer, the shape of the contact portion may be a projection shape similar to a bump contact, a plane shape flush with the reference plane, a shape recessed from the reference plane, etc as long as it can make a preferable contact with the electrode of the chip. Generally, the height of the designed size of the contact portion is −5 μm to +20 μm from the surface of the first insulating layer.

Figure 4A:
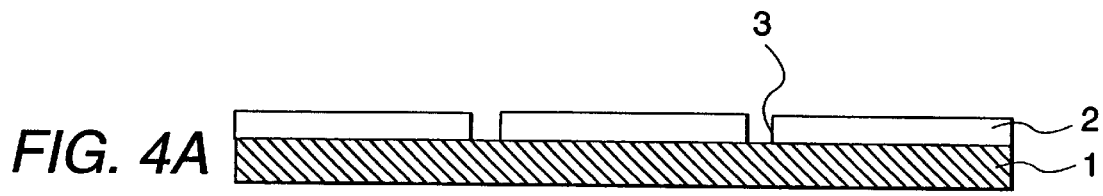
FIGS. 4A to 4F are sectional views of an interposer for explaining the process of manufacturing the interposer according to a configuration (I) of the present invention.
Figure 4B:
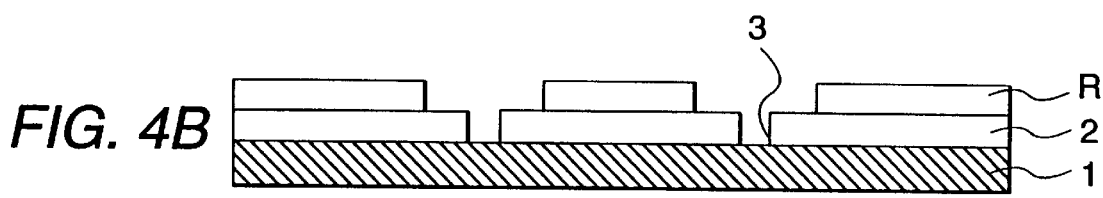
Figure 4C:
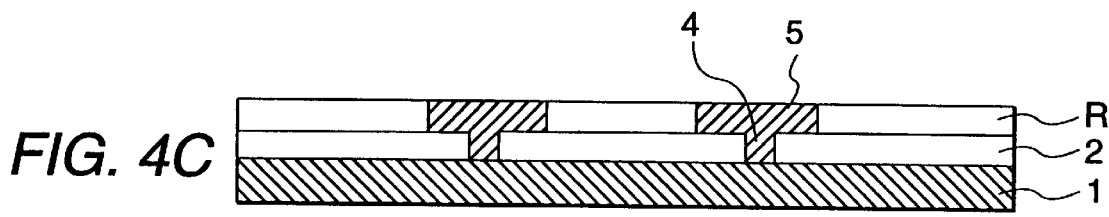
Figure 4D:
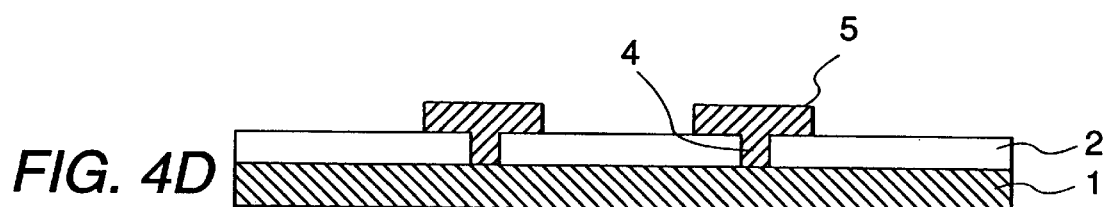
Figure 4E:
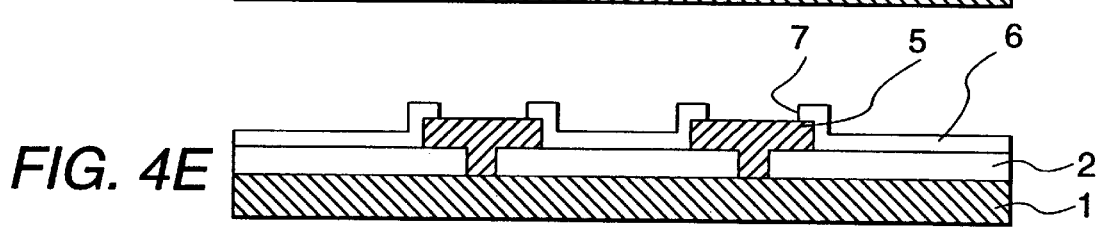
Figure 4F:
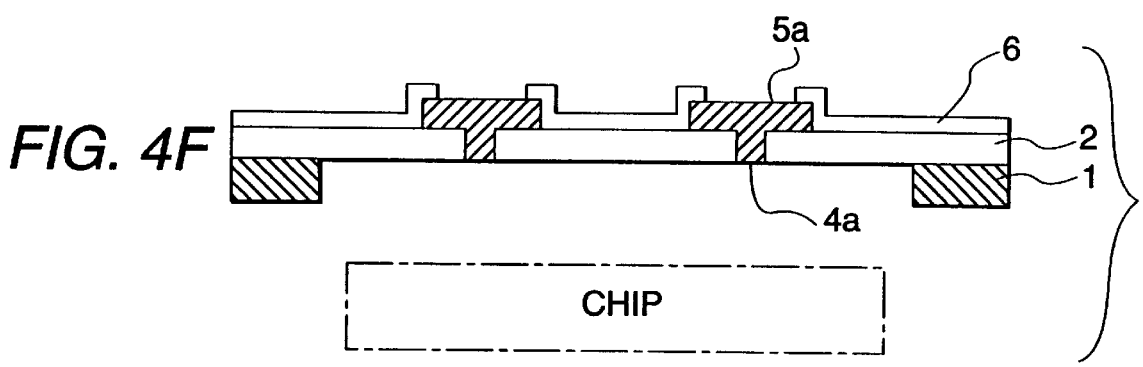

Although the cathode substrate may be removed entirely, as seen from FIGS. 3 and 4F, its central potion may be removed to correspond to the external shape of the chip so that it receives the chip in connection thereto. The cathode substrate remaining so as to form a square ring supports the outer periphery of the interposer as a frame and so it is preferable from the standpoint of mechanical strength. It is an example of the interposer according to the eleventh aspect of the present invention.

Figure 2A:
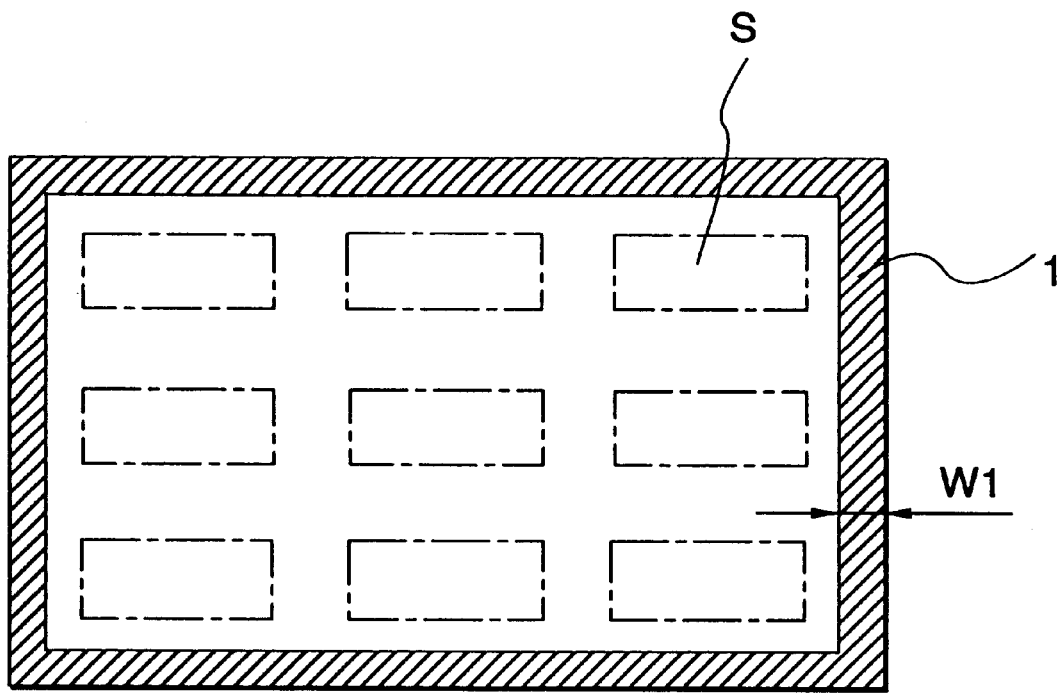
FIGS. 2A and 2B are views of a removal pattern hatched on a cathode substrate in a typical interposer manufactured by the method according to the present invention.
Figure 2B:
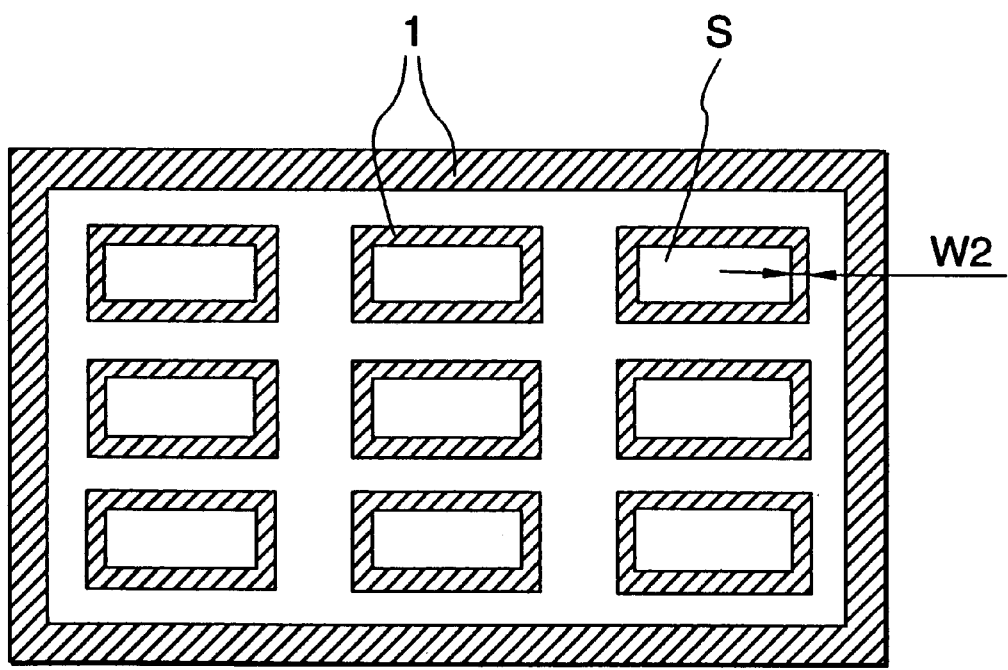

Also in the case where a large number of interposers are formed in a monolithic cathode substrate and are divided in a final step, as shown in FIG. 2A, the cathode substrate 1 may be removed so that it constitutes a frame pattern which wholly surrounds and supports the individual interposers S. Otherwise, as shown in FIG. 2B, the cathode substrate 1 may be removed so that it constitutes a frame pattern which individually surrounds and supports the individual interposers S. The thus formed intermediate member before divided is that of the interposer according to the twelfth or thirteenth aspect of the present invention. The frame pattern may be not only an outer frame detouring the outer periphery of the chips, but also a skeleton crossing the central regions of the chips.

Now referring to FIGS. 5A–5F, an explanation will be given of the aspect in which the first insulating layer formed first on the cathode substrate is located on the side of being connected to the circuit board, i.e. the aspect of the first aspect provided with the third aspect (hereinafter referred to as the configuration of (II)). The sixth and seventh aspects will be also referred to.

Figure 5A:
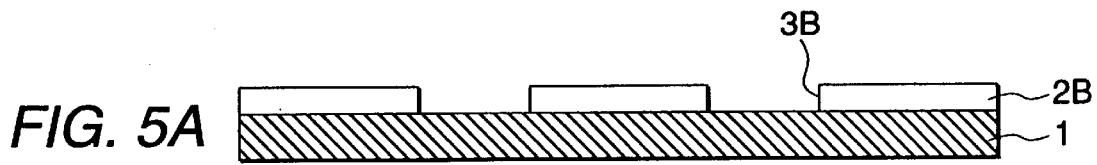
FIGS. 5A to 5F are sectional views of an interposer for explaining the process of manufacturing the interposer according to a configuration (II) of the present invention.

As described previously, the significant difference of the configuration of (II) from the configuration of (I) resides in that the first insulating layer first formed on the cathode substrate and the second insulating layer formed thereafter are reverse in their material, size and object to be connected, and also reverse in the order of forming the stacking structure of the interposer on the cathode substrate. Specifically, in the configuration of (II), the second insulating layer in the configuration of (I) is first formed as a first insulating layer 2B (FIG. 5A). This permits the difference in the heights of the contacts connected to a circuit board to be reduced.

In the configuration of (II), since the first insulating layer serves as a layer connected to the circuit board, in the second step, as shown in FIG. 5A, an opening 3B is made in the first insulating layer 2B at a position corresponding to the conductor pad of the circuit board serving as a connection object so that the surface of the cathode substrate is exposed in the internal bottom of the opening 3B.

Figure 5B:
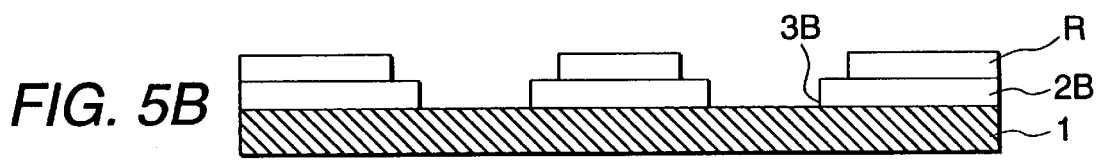
Figure 5C:
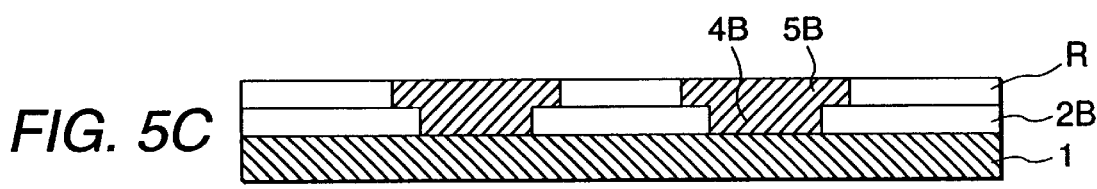

In the third step in the configuration of (II), as shown in FIG. 5C, the metal for the conductive path is precipitated and filled in the opening 3B by electroplating using the cathode substrate 1 as a cathode, thereby making a conductive path 4B. In this case, like the configuration of (I), by continuing the plating from completion of the conductive path, in the fourth step, a circuit pattern 5B can be successively formed of the same material as that of the conductive path.

Figure 5D:
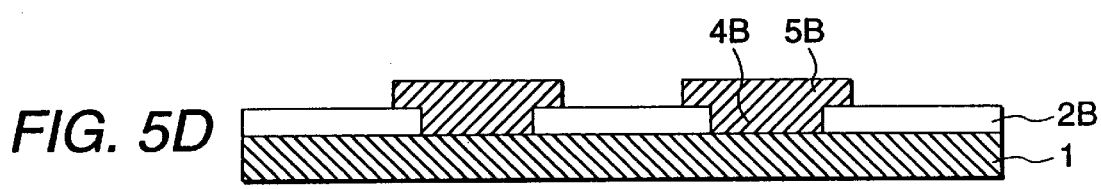
Figure 5E:
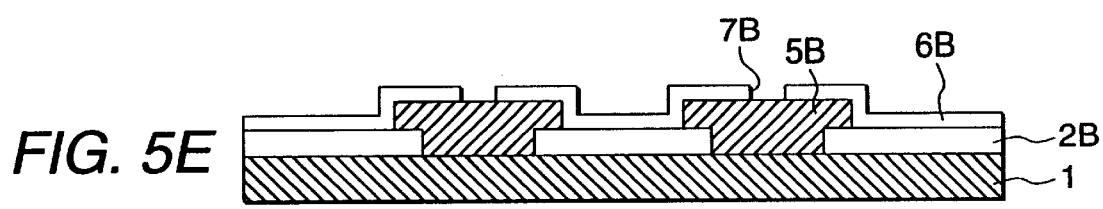
Figure 5F:
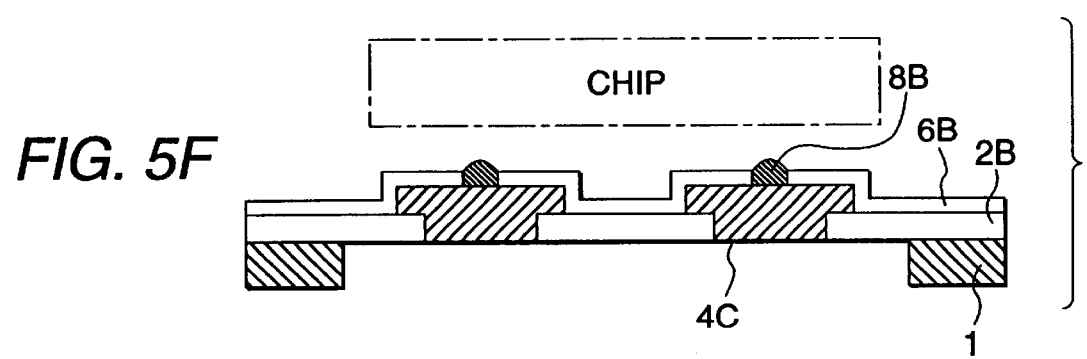
Figure 6A:
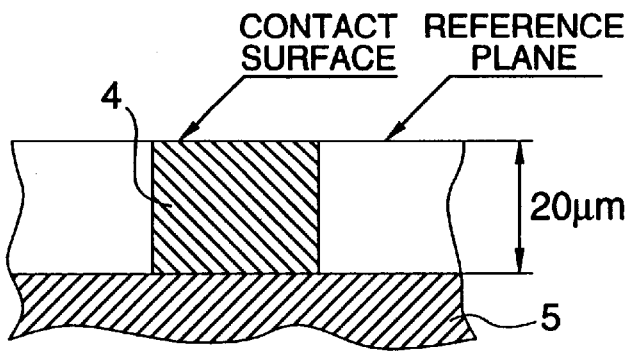
FIGS. 6A and 6B are views for explaining the process for making the contact according to the present invention.
Figure 6B:
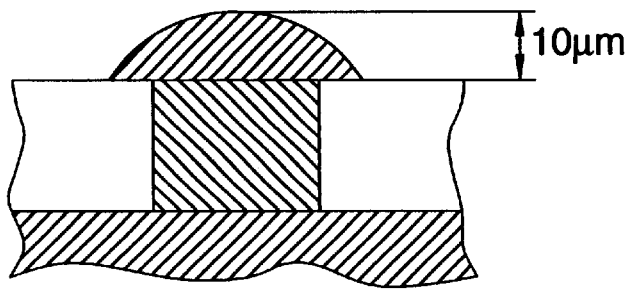
Figure 6C:
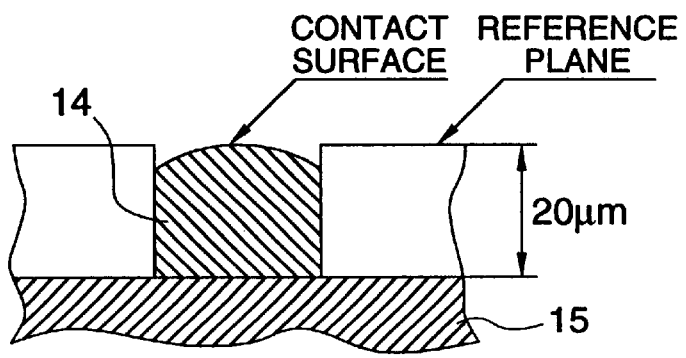
FIGS. 6C and 6D are views for explaining the process for making the contact according to conventional art.
Figure 6D:
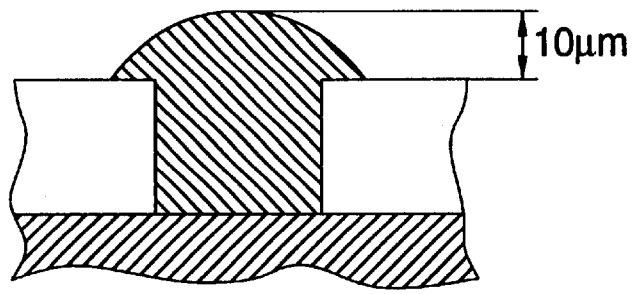
Figure 7A:
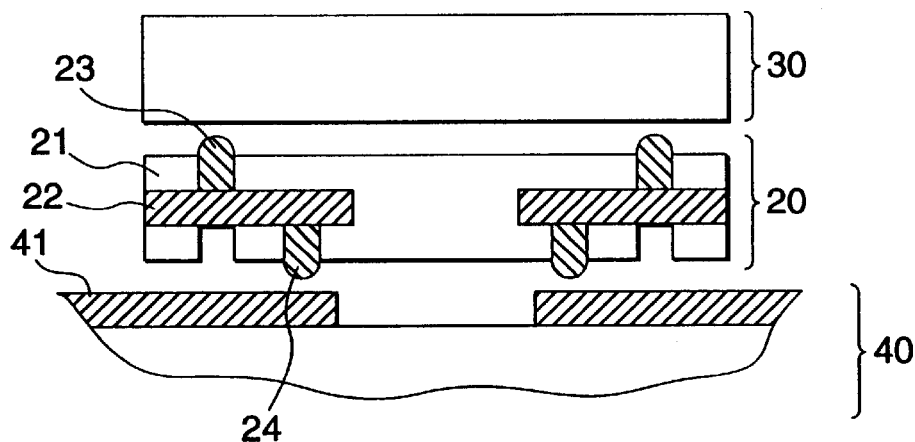
FIGS. 7A and 7B are sectional views of a conventional interposer.
Figure 7B:
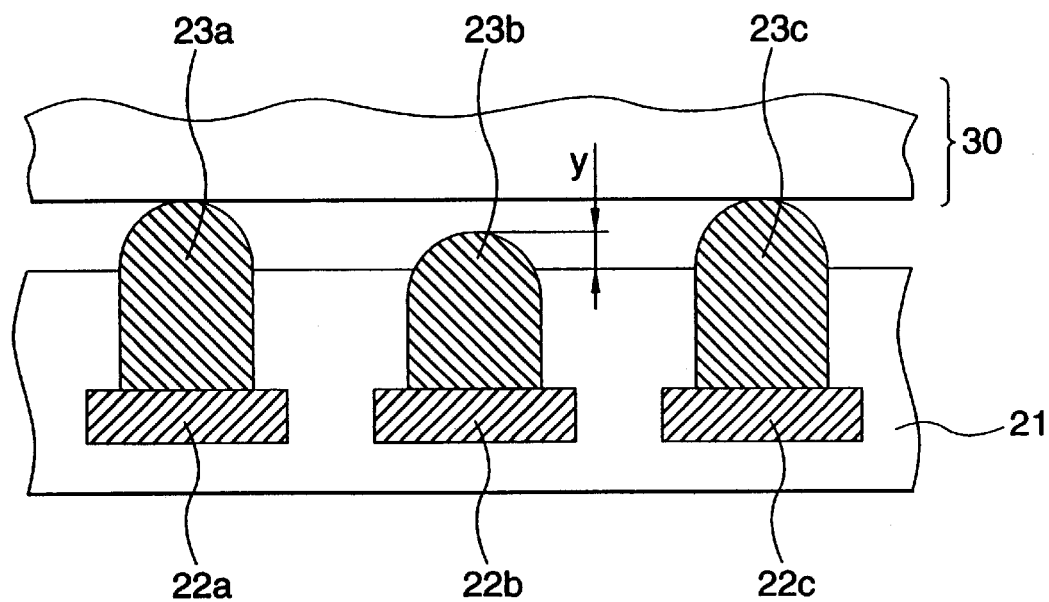

The sixth aspect maybe added to the configuration of (II). Specifically, as shown in FIG. 5E, after the fourth step, the fifth step is carried out of forming a second insulating layer 6 to cover the circuit pattern 5B; making an opening 7B exposing the circuit pattern 5B at a position corresponding to the electrode of the chip serving as a connection object and filling the opening 7B with metal as shown in FIG. 5F to form a conductive path so that the end surface of the conductive path is used a contact for connection to the chip. The second insulating layer 6B can be formed in the same manner as the first insulating layer in the configuration of (I).

Since the first insulating layer 2B does not require adhesiveness, it may be made of photosensitive resin having a high curing temperature of 400° C. If it additionally includes a photosensitive and thermally melting type resin (having a curing temperature of 300° C.) as explained with reference to the configuration of (I), both insulating layers having the high curing temperature and low curing temperature can be formed in this order, thereby exhibiting their most preferred property. This is the seventh aspect of the present invention.

In the fifth step in the configuration of (II), as shown in FIG. 5F, the cathode substrate 1 is removed partially or entirely to expose the first insulating layer 2B inclusive of the end surface 4C of the conductive path 4B. The exposed end surface 4C of the conductive path is a contact with a height difference suppressed and to be electrically connected to the conductor pad of the circuit board. Although the exposed end surface 4C may be used as a contact surface as it is, the surface layer is preferably made of a preferred metallic material.

The configuration of (II) is reverseto the configuration of (I) in the order of forming the respective elements of the interposer. The specification and method of forming these elements can be referred to the configuration of (I).

Embodiments

An explanation will be given of the method of forming the interpose according to the present invention along the process of actually manufacturing an interposer.

Embodiment 1

In this embodiment, an interposer was manufactured according to the manufacturing method having the configuration (I). Interposers each having an outer size of 14 mm×7 mm were arranged in a matrix of 20×12 on a cathode substrate having an outer size of 250 mm×250 mm. The cathode substrate was entirely removed to observe the state of each contacts. Division into final individual interposers were not made. A detailed explanation will be made of the respective manufacturing steps.

As seen from FIG. 4A, an SUS plate having a thickness of 25 mm and an outer size of 250 mm×250 mm was prepared as the cathode substrate 1, and a first insulating layer 2 having a thickness of 15 μm was formed on the one surface of the plate. The first insulating layer 2 is made of a material mainly composed of negative-type polyimide resin. In the stage where the first insulating layer is formed, it is a photosensitive polyimide precursor having the following composition.

Acid dianhydride component: ODPA (1.0 mol)
Diamine component: MAPB (0.8 mol), APDS (0.2 mol)
Photosensitive agent: 1-ethyl-3,5-dimethoxycarbonyl-4-(2-nitrophenyl)-1,4-dihydropyridine (0.26 mol)

The solution obtained by dissolving the material having the above composition in an organic solvent was applied onto the cathode substrate using a coating tool. The cathode substrate was dried for 20 minutes at 100° C.

The first insulating layer was irradiated with rays (i-rays) for light exposure through a photomask and heated for ten minutes at 155° C. The first insulating layer was subjected to development using an alkaline solution. Thus, as seen from FIG. 4A, openings each having a diameter of 50 μm were formed at the positions corresponding to chip electrodes so that the cathode substrate was exposed on the inner bottom surface of each opening. The cathode substrate was heated for 30 minutes at 300° C. so that the polyimide precursor serving as the first insulating layer was deformed into polyimide.

By the vacuum sputtering deposition, the surface of the first insulating layer and the inner wall and inner bottom of each opening 3 were successively coated with a chrome (Cr) film having a thickness of 300 Å and a copper film (Cu) having a thickness of 1000 Å thereon (not shown).

As shown in FIG. 4B, by a known technique using a dry film resist having a thickness of 15 µm, a resist pattern R was formed to a prescribed circuit pattern.

As shown in FIG. 4C, with the cathode substrate (strictly speaking, the surface of the substrate is covered with the copper film) as a cathode, by a conventional electroplating, the opening is filled with Cu and the circuit pattern 5 made of Cu was precipitated. The circuit pattern 5 was given the same thickness of 15 µm as that of the resist. Thereafter, the resist pattern R was removed using an alkaline medicine solution. Further, the Cu film on the bottom of the resist pattern was removed using an acidic medicine solution, and the Cr film (formed by the above sputtering) was removed by an alkaline medicine solution. Thus, the circuit patterns 5 were completed as shown in FIG. 4D.

A second insulating layer 6 having a thickness of 10 µm was formed on the circuit pattern 5 thus formed. The first insulating layer 2 is made of a material mainly composed of negative-type polyimide resin. In the stage (before light-exposure) where the layer is formed, it is a photosensitive polyimide precursor having the following composition.

Acid dianhydride component: ODPA (0.5 mol), 6FDA (0.5 mol)
Diamine component: DDE (0.5 mol), APDS (0.5 mol)
Photosensitive agent: 1-ethyl-3,5-dimethoxycarbonyl-4-(2-nitrophenyl)-1,4-dihydropyridine (0.26 mol)

Taking the thermal affect on the first insulating layer 2 into consideration, the composition of this photosensitive polyimide precursor was determined to have an appropriate curing temperature of 300° C.

The solution obtained by dissolving the material having the above composition in an organic solvent was applied onto the cathode substrate by a spin coating technique. The cathode substrate was dried for 20 minutes at 100° C. to create the second insulating layer 6.

The second insulating layer was irradiated with rays (i-rays) for light exposure through a photomask and heated for ten minutes at 155° C. The second insulating layer was subjected to development using an alkaline solution. Thus, as seen from FIG. 4E, openings 7 each having a diameter of 400 µm were formed at the positions corresponding to the solder balls for connection to the substrate) so that the cathode substrate was exposed on the inner bottom surface of each opening. The cathode substrate was heated for 30 minutes at 300° C. so that the polyimide precursor serving as the first insulating layer was deformed into polyimide.

The openings 7 were covered with a protective film (slightly adhesive type, acid-resistant and alkaline-resistant) using a roll laminator. By a conventional chemical etching using ferric chloride, the cathode substrate 1 was removed entirely to expose the first insulating layer and the end surface of the conductive path. The Cr film remaining on the exposed end surface of the conductive path was removed by an alkaline medicine solution, and the protective film was also removed.

Finally, the exposed end surface of the conductive path and the circuit pattern exposed in the opening 7 were plated with a film having a thickness of about 1 pm to create a contact. Thus, a sheet-like collection of a plurality of interposers were acquired.

The contacts of the interposers on the chip side had the heights protruding by the thickness of the Au plated film of 1 µm from the surface of the first insulating layer over the entire region of the cathode substrate 1 having a size of 250 mm square, and had a variation of ±0.5 µm or less.

Embodiment 2

In this embodiment, a plurality of interposers were formed on the cathode substrate in entirely the same as the first embodiment except that the cathode substrate was not removed entirely, but left as a frame inclusively surrounding all the interposers as shown in FIG. 2A.

The belt of the frame as shown in FIG. 2A has a width of 7 mm. The interposers acquired will not curl in the state of a sheet-like intermediate body before packaging. They enjoy preferable handling and positioning for a packaging machine, and processed in a line of an automatic machine.

Embodiment 3

In this embodiment, interposers as shown in FIG. 3 which extend outwardly from the external shape of a chip were manufactured to handle the chip having a large number of electrodes according to the configuration (I). In the stage of an intermediate body, as shown in FIG. 2B, in addition to the second embodiment, the cathode substrate 1 was left as frames to surround individual interposers S. The individual frames have a thickness of 1.5 mm, respectively. These frames, which serve to reinforce the interposers lying off the exterior of the chip, were housed in a package with the chip after they have been cut. The manufacturing process is entirely the same as the first embodiment.

The interposers thus acquired enjoy preferable handling and positioning for a packaging machine in the state of a sheet-like intermediate body before packaging as in the second embodiment and could be processed in a line of an automatic machine. After the packaging and cutting, the part of the interposers which lie off the chip was given rigidity so that the package body with improved handling and connection to the external device could be realized.

Embodiment 4

In this embodiment, an interposer was manufactured according to the manufacturing method having the configuration (II). Like the first embodiment, interposers each having an outer size of 14 mm×7 mm were arranged in a matrix of 20×12 on a cathode substrate having an outer size of 250 mm×250 mm. The cathode substrate was entirely removed to observe the state of each contacts. Division into final individual interposers were not made. A detailed explanation will be made of the respective manufacturing steps.

As seen from FIG. 5A, an SUS plate having a thickness of 25 mm and an outer size of 250 mm×250 mm was prepared as the cathode substrate 1, and a photosensitive polyimide precursor varnish having a thickness of about 20 µm was applied on the one surface of the plate so that it has a thickness of 10 µm after dried. This photosensitive polyimide precursor has the following composition at the curing temperature of 400° C.

Acid dianhydride component: ODPA (0.5 mol), BPDA (0.5 mol)
Diamine component: PPD (0.5 mol), DDE (0.5 mol)
Photosensitive agent: 1-ethyl-3,5-dimethoxycarbonyl-4-(2-nitrophenyl)-1,4-dihydropyridine (0.26 mol)

Using a glass photomask with a pattern of an outer pad pattern of the interposers plotted to correspond to the positions of the conductor pads of the circuit board to be connected, the polyimide precursor was exposed with an irradiation quantity of 300 mJ. It was heated for three minutes at 175° C. and developed by an alkaline solution at 45° C. Thereafter, it was cured at 400° C., thereby providing a first insulating layer having a thickness of 10 μm on the side of the circuit board (outer polyimide insulating layer).

By the vacuum sputtering deposition, the polyimide insulating layer were successively coated with a chrome (Cr) film having a thickness of 300 Å, and a copper film (Cu) having a thickness of 2000 Å thereon (not shown). Further, the surface of the insulating layer is covered with a photosensitive dry film resist layer having a thickness of 10 μm and subjected to light-exposure and development. Thus, a resist pattern R was formed to a prescribed circuit pattern as shown in FIG. 5B.

As shown in FIG. 5C, with the cathode substrate (strictly. speaking, the surface of the substrate is covered with the copper film) as a cathode, by a conventional electroplating, the opening is filled with Cu to form a conductive path 4B and a circuit pattern 5B made of Cu was precipitated. The circuit pattern 5B was given the same thickness of 15 μm as that of the resist pattern R. Thereafter, the resist pattern R was removed using a 5% NaOH water solution. Further, the Cu film and Cr film formed by the sputtering were removed by medicine solutions to provide a target Cu circuit pattern 5B as shown in FIG. 5D.

Further, a photosensitive polyimide adhesive precursor varnish was applied on the Cu circuit pattern. This photosensitive polyimide adhesive precursor has the same composition as that used as the first insulating layer in the first embodiment. Using a glass photomask with an opening pattern (inner pad pattern) on the chip side of the interposers plotted so as to correspond to the positions of the electrodes of the circuit chip to be connected, the polyimide precursor was exposed with an irradiation quantity of 100 mJ. It was heated for three minutes at 175° C. and developed by an alkaline solution at 45° C. Thereafter, it was cured at 300° C., thereby providing a second insulating layer (polyimide adhesive layer) 6B having an opening 7B and a thickness of 10 μm on the side of the chip as shown in FIG. 5E.

The opening 7B was filled with Cu by electrolytic Cu plating and precipitation of Cu was continued until it projects. Thus, as shown in FIG. 5F, a bump contact 8B was formed to provide a bump contact 8B which serves as a contact point with a semiconductor chip to be connected. The bump contact was caused to have a height of 5 μm protruding from the surface of the adhesive.

A pattern of the dry film was formed on the rear surface of the cathode substrate 1. Further, a protective film was formed on the entire surface of the adhesive. By the known etching using ferric chloride-hydrochloric acid, as shown in FIG. 5F, a predetermined area of the cathode substrate was removed to leave as a frame shape. The Cr film exposed to the removed area was also removed by another medicine solution. Thereafter, the dry film and protective film were removed.

Finally, the bump contact 8B formed on the inner side and outer pad 4C (surface of the conductive path on the circuit board) were plated with an Au film having a thickness of about 1 μm. Thus, a sheet-like collection of a plurality of interposers were acquired.

Like the first embodiment, the contacts of the interposers on the circuit board side had the heights protruding by the thickness of the Au plated film of 1 μm from the surface of the first insulating layer over the entire region of the cathode substrate 1 having a size of 250 mm square, and had a variation of ±0.5 μm or less.

In this embodiment, both first insulating layer and second insulating layer completely satisfy the temperature condition for curing so that their characteristics were not damaged entirely. Specifically, with respect to the insulating layer on the side of the circuit board, the first insulating layer (layer 6 in FIG. 4F) in the first embodiment and first insulating layer (layer 2B in FIG. 5F) were produced by curing the polyimide acid having the same composition. Nevertheless, the layer 6 in the first embodiment was not fully cured at 300° C., whereas the layer 2B in this embodiment was cured fully at 400° C. Thus, the first insulating layer according to this embodiment (insulating layer on the circuit board side) could have higher mechanical strength.

Embodiment 5

In this embodiment, the interposers were manufactured in the same process as in the fourth embodiment except that the area of the cathode substrate 1 as shown in FIG. 5F was removed entirely but not partially.

As in the fourth embodiment, the thus manufactured interposers had a variation of ±0.5 μm or less in the height of the contact from the surface of the first insulating layer. Both first and second insulating layer satisfy the temperature condition and hence could exhibit the essential features of the respective resin layers.

COMPARATIVE EXAMPLE

For comparison with the manufacturing method according to the present invention, the interposers having the same specification were manufactured by a conventional method to examine a variation of the heights in the contacts.

Forming the first insulating layer on a copper foil for a circuit pattern:

First, as shown in FIG. 8A, an electrolytic copper foil 11 which serves as a circuit pattern (having a thickness of 25 mm and an outer size of 250 mm×250 mm) was prepared, and a first insulating layer 2 having a thickness of 15 μm was formed on the one surface of the foil. Openings 13 each having a diameter of 50 μm were formed at the positions corresponding to the electrodes of a chip.

The first insulating layer 12 was made of the same material as the first insulating layer 2 as in the first embodiment. The respective layers and openings were made in the same manner as in the first embodiment.

Using a dry film resist having a thickness of 15 μm, a resist pattern R1 was formed to a prescribed circuit pattern. As shown in FIG. 8B, by the chemical etching using ferric chloride, an electrolytic copper foil 11 was processed into a circuit pattern 15. As shown in FIG. 8C, the resist pattern R1 was removed. During the process, the openings 13 were protected using a protective film as in the embodiments described above.

As shown in FIG. 8D, an insulating layer 16 (having a thickness of 10 μm) which covers the circuit pattern 15 and openings 17 each having a diameter of 400 μm were formed in the insulating layer. The insulating layer 16 was made of the same material and in the same process as the insulating layer in the first embodiment. The openings 17 were made at the same positions and in the same process as the openings 7 in the first embodiment.

In order to protect the surface 15a of the circuit pattern in the opening 17 of the insulating layer 16, the entire insulating layer 16 was covered with a protective film (not shown). As a pre-treatment of plating, the surface of the circuit pattern 15 exposed to the inner bottom of the opening 13 was etched by a thickness of 3 μm by an acidic medicine.

As shown in FIG. 8E, using the circuit pattern 15 as a cathode, by a conventional electroplating, the opening 13 is filled with Cu to form a conductive path 14. The end surface 14a of the conductive path 14 was made in flush with the surface of the first insulating layer 12 (substrate surface). Thereafter, the protective film covering the insulating layer 16 was removed. By the electroplating using the circuit pattern 15 as a cathode, the surface 15a of the circuit pattern in the opening 17 and the end surface 14a of the conductive path 14 were plated with a film of Au having a thickness of about 1 μm, thereby providing a contact portion. Thus, a sheet-like collection of a plurality of interposers were acquired.

The heights of the contacts of the interposers thus acquired were examined over the entire area of 250 mm×250 mm. As a result, the height of the contact in the neighborhood of the center in the entire region was flush with or projects by 0–1 μm from the first insulating layer 12. The contact on the outer periphery dents into the opening by 4–5 μm from the surface of the insulating layer 12. All the contacts (about 18000) over the entire region were examined. 38 bumps distributed at random were lower by 5–6 μm or more than the surface of the first insulating layer. The interposers including contacts having such a lower height could not be reliably connected to the electrodes of the chip.

The meritorious effects of the present invention can be summarized as follows.

In the method of manufacturing the interposer according to the present invention, after a conductive path has been formed by electroplating on a cathode substrate, the cathode substrate is removed finally so that the end surface of the conductive path is exposed as a contact surface. This reduces a variation in the heights of the contacts thus acquired, thereby greatly improving reliability of the connection of the contact to a chip or circuit board.

Further, in the present invention, where the respective insulating layers on both chip and circuit board sides are made of photosensitive resin, the difference between their curing temperatures was noticed. Particularly, where only the insulating layer on the chip side is made of a thermal melting type adhesive resin, the difference in the curing temperature is very large. In such a case, the present invention proposes to form the resin (insulating layer on the circuit board) having a higher curing temperature precedently on the cathode substrate. This permits both insulating layers to be cured at optimum temperatures, respectively. Thus, the respective insulating layers can exhibit their own inherent properties without being influenced by each other.

The interposer according to the present invention has improved a variation of the heights of the contacts. In addition to this basic feature, the present invention is characterized in that the cathode substrate is removed to be left as a frame. This makes it unnecessary to prepare a metallic jig for supporting when the chip is packaged in the interposer. The interposer having a size extended out from the chip can be given stiffness to the extended out region so that the connection to an external circuit and its handling can be improved.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method for manufacturing an interposer for a chip size package, comprising steps of:

(1) forming a first insulating layer on a substrate for a cathode comprising metal usable as the cathode of electroplating;

(2) forming a first opening at a position of said first insulating layer corresponding to a conductor portion of an object for connection so that a surface of said substrate is exposed to an inner bottom of the opening;

(3) filling said first opening with metal by electroplating using said substrate as a cathode, thereby forming a conductive path in the first opening;

(4) forming a circuit pattern in contact with said conductive path on said first insulating layer; and (5) removing said substrate partially or entirely to expose said first insulating layer inclusive of an end surface of the said conductive path.

2. A method for manufacturing an interposer according to claim 1, wherein said conductive portion of the object for connection is an electrode of a chip.

3. A method for manufacturing an interposer according to claim 1, wherein said conductor portion of the object for connection is a conductor portion of a circuit board.

4. A method for manufacturing an interposer according to any one of claims 1 and 2, wherein said first insulating layer comprises photosensitive and thermal melting type adhesive resin.

5. A method for manufacturing an interposer according to claim 1, after the step of (4), further comprising steps of:

forming a second insulating layer so as to cover said circuit pattern; and forming a second opening from which said circuit pattern is exposed.

6. A method for manufacturing an interposer according to claim 1, wherein said conductor portion of the object for connection is a conductor portion of a circuit board, and after the step of (4), the method further comprising steps of:

forming a second insulating layer so as to cover said circuit pattern;

forming a second opening exposing said circuit pattern at a position of an electrode of a chip which is the object for connection; and filling the second opening with metal.

7. A method for manufacturing an interposer according to claim 6, wherein said first insulating layer comprises photosensitive resin, and said second insulating layer comprises photosensitive and thermal melting type adhesive resin.

8. A method for manufacturing an interposer according to claim 1, wherein said substrate for a cathode is removed to be left as a frame for supporting the interposer on its periphery in the step of (5).

9. A method for manufacturing an interposer according to claim 1, wherein said substrate has an outer size enough to arrange a plurality of interposers for a chip size package, and the plurality of interposers are formed on said substrate in a state they are collected on said substrate and can be separated in individual components after the steps (1) to (5).

10. A method for manufacturing an interposer according to claim 9, wherein said substrate is removed to be left as frames which surround and support the plurality of interposers individually in the step of (5).

11. A method for manufacturing an interposer according to claim 9, wherein said substrate is removed to be left as a frame which inclusively surrounds the plurality of interposers in the step of (5).

* * * * *